(12) United States Patent
Contreras et al.

(10) Patent No.: US 7,786,754 B2
(45) Date of Patent: Aug. 31, 2010

(54) HIGH SPEED DIGITAL SIGNALING APPARATUS AND METHOD USING REFLECTED SIGNALS TO INCREASE TOTAL DELIVERED CURRENT

(75) Inventors: John Thomas Contreras, Palo Alto, CA (US); Luiz Franca-Neto, Sunnyvale, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

(21) Appl. No.: 12/283,225

(22) Filed: Sep. 9, 2008

(65) Prior Publication Data

US 2010/0061005 A1   Mar. 11, 2010

(51) Int. Cl.
*H03K 17/16* (2006.01)
(52) U.S. Cl. .......................... 326/30; 326/82
(58) Field of Classification Search ............ 326/26, 326/27, 30, 83–87
See application file for complete search history.

(56) References Cited

U.S. PATENT DOCUMENTS

| | | | |
|---|---|---|---|
| 3,660,675 A * | 5/1972 | Andrews, Jr. ............... | 326/30 |
| 4,414,480 A | 11/1983 | Zasio | |
| 5,705,937 A | 1/1998 | Yap | |
| 5,731,711 A * | 3/1998 | Gabara ...................... | 326/30 |
| 5,822,141 A | 10/1998 | Chung et al. | |
| 6,154,047 A * | 11/2000 | Taguchi ..................... | 326/30 |
| 6,201,653 B1 | 3/2001 | Contreras et al. | |
| 6,323,672 B1 | 11/2001 | Starr | |
| 6,323,673 B1 | 11/2001 | Starr | |
| 6,356,113 B1 | 3/2002 | Contreras et al. | |
| 6,577,179 B2 | 6/2003 | Falconer | |
| 6,671,113 B2 | 12/2003 | Klaassen et al. | |
| 6,721,115 B2 | 4/2004 | Price | |
| 7,009,894 B2 | 3/2006 | Mukker et al. | |
| 7,035,028 B2 | 4/2006 | Venca et al. | |
| 7,133,234 B2 | 11/2006 | Bloodworth et al. | |
| 7,206,155 B2 | 4/2007 | Kuehlwein et al. | |
| 2002/0167331 A1* | 11/2002 | Huang et al. ................ | 326/30 |
| 2006/0119970 A1 | 6/2006 | Hayashi et al. | |
| 2007/0210070 A1 | 9/2007 | Contreras et al. | |
| 2008/0112085 A1 | 5/2008 | Contreras et al. | |

* cited by examiner

*Primary Examiner*—Don P Le
(74) *Attorney, Agent, or Firm*—G. Marlin Knight

(57) ABSTRACT

A signaling apparatus and method are described that use reflected signals to increase the total current delivered to a receiver. Dynamic source-side transmission line termination control is employed to generate reflected signals that constructively add to a nonreflected signal to enhance the signal at the receiver. Switching controls selectively connect and disconnect the transmission line source-side termination resistors to either provide signal termination or remove it. Driver designs using either voltage or current sources for use in signaling systems (including, for example, magnetic storage devices with inductive coil based write heads) are described.

19 Claims, 6 Drawing Sheets

X's Mark Switch Configuration Change Points

HIGH SPEED DIGITAL SIGNALING APPARATUS AND METHOD USING REFLECTED SIGNALS TO INCREASE TOTAL DELIVERED CURRENT

FIELD OF THE INVENTION

This invention relates to high speed signaling systems using pre-emphasis of the transmitted signal.

BACKGROUND

There are many applications in which it is desirable to enhance transition speed of a signal that is transmitted on a transmission line to a transducer or receiver. It is also important to provide this enhancement while expending the least amount of power, or no extra power at all. In the following, the particular example of a current delivered the write coil of a magnetic data storage device will be used as an illustrative example, which also includes the additional challenge of maintaining the write current level in the coil while lowering power dissipation in the system. The current invention however has broader application as will be appreciated by those of skill in the art.

Magnetic data storage devices include front-end circuits 10 (see FIG. 1) that read and write the data to the storage media, such as used in hard disk drive (HDD) storage devices, typically include one or more pairs of magnetic transducers 23, 24 for reading and writing magnetic transitions in magnetic media. The slider 13 includes the read and write transducer elements. The read transducer element 23 and write transducer element 24 are also called the read head and write head respectively. The slider 13 is mounted on an actuator arm (not shown) which mechanically positions the transducers over selected tracks on the magnetic media on rotating disks (not shown). The electrical signals to and from the read and write transducer elements are processed by appropriate electronic circuitry in read amplifier 21 and write driver 22 which are connected through electrically conductive paths 25A, 25B, 26A, 26B. The read/write channel 20 reads data from the read amplifier 21 and supplies data signals to write driver 22.

The write transducer 24 writes digital information on the rotating disk media on the disk by creating magnetic flux reversals that corresponds to write signal. The terms write head, write transducer, write element and write coil will be used interchangeably herein. The electrical current for the write coil is supplied by write driver 22. The direction of the current flow in the coil, which determines the polarity of generated magnetic field, is typically controlled by four transistor switches (not shown) in an "H-bridge" arrangement in the write driver circuit.

The spectral content of the write signals tend to have higher frequency components than the read signals due to the square wave nature of the write voltage (or current) signals generated in the write driver. To achieve high-data rates, low loss high bandwidth transmission lines are used between the write driver and the write elements. In addition, the write transducer's magnetic switching speed can be relatively slow compared to the desired data rate, which requires a boost or overshoot during write signal reversals. In the interest of avoiding undesirable signal reflections back to the write element, prior art write drivers deliver current to the coil through transmission lines with static (unswitched) source termination. Write drivers can generally be of voltage-type or current-type. Voltage-type write drivers with standard statically terminated lines are required to operate with voltage supply levels of the order of $2Z_o I_w$, where $Z_o$ is the characteristic impedance of transmission line connecting the write driver to the coil, and $I_w$ is the current required by the coil. Current-type write drivers use shunt-type line termination and therefore need, at launch, to be able to provide current levels of the order of $2I_w$ to achieve $I_w$ in the coil.

Designing for low power typically entails lowering the voltage of operation. Since the amount of current for proper magnetic recording to be delivered to the write coil in a magnetic recording systems is fixed by physical constraints in head and media design, lowering the voltage of operation involves lowering the characteristic impedance of the trace interconnections between the write driver and the write coil. This requires specific design to enable low insertion loss, large bandwidth and adequate physical widths of the low impedance transmission lines.

Prior art design techniques match the write driver's output impedance value to be equal or a small percentage greater than the characteristic impedance of the transmission line. If the write driver's impedance is significantly mismatched with the characteristic impedance of the transmission line, undesirable signal reflections can occur in prior art designs. The reflected signal can interfere with the transmitted signal, causing distortion and degrading signal integrity. In the prior art the undesirable reflected signal is, therefore, terminated at the write driver's output, which is also called source-side termination.

FIG. 2 is a conceptual illustration of a prior art current-source-type write driver 22a with current sources 34, 35 and a receiver 24A modeled as simple LRC elements. The write driver 22a could be used in a disk drive, for example, and receiver 24A can be a component similar to an inductive write coil in a disk drive. The connections or leads 26C, 26D to the receiver 24A have characteristic transmission line impedances of $Z_1$ and $Z_2$ which are each one-half of the total $Z_o$. Transistor switches 31a-d (in the "H-bridge" arrangement) control the direction (polarity) of current flow through the receiver 24A. The transistor switches are shown in symbolic form to indicate the open (high impedance) or closed (conducting/low impedance) state. In an H-bridge circuit, one leg or the other of the bridge is supplying current into the receiver 24A. In the case of a disk drive, the transition from one polarity to the other records information in the magnetic media. As shown, switches 31b and 31c are open while 31a and 31d are closed to apply current in one direction through the receiver 24A. The state of the switches is reversed to apply current in the opposite direction through the receiver 24A. In this configuration resistors 29a, 29b provide termination. In a fully differential operation, the node "C" in FIG. 2 behaves as a virtual ground.

U.S. Pat. No. 4,414,480 to Zasio describes an output circuit designed to take advantage signal reflection for a nonterminated line where the receiving circuit appears as an open circuit to the transmission line. Since the output signal is completely reflected when it reaches the output end of the transmission line, the amplitude of the signal at the receiving circuit can be double that of the initial signal provided by the output circuit. This is due to the reflected signal combining with the incident signal. This cuts the drive current requirements of the output circuit in half. However, if the signal were to be reflected by the output circuit, this could interfere with the detection of switching transitions. In order to avoid this, the output circuit is designed so that its output impedance is approximately equal to the characteristic impedance of the transmission line. Therefore, the output circuit provides a series termination for the input end of the transmission line and will completely absorb the reflected signal.

U.S. Pat. No. 6,671,113 to Klaassen, et al. describes a write driver circuit that reduces the reversal time for the current through the inductive recording head, The write driver output stage includes a source-side termination circuit having output impedance $Z_S$, wherein the source-side termination circuit output impedance $Z_S$ is substantially equal to $Z_O$ and the source strength $S_O$ (which represents current drive capability) of the write driver at the input of the interconnect circuit is temporarily enlarged after every polarity reversal of the write signal for a predetermined time duration. Klaassen's source-terminated current-type write driver embodiment shows the write driver source strength enhancement is obtained by connecting a short current pulse to the input terminals of the integrated lead suspension (ILS) so that a higher voltage step is created across the ILS input terminals during a current reversal.

U.S. Pat. No. 6,721,115 to John Price, Jr. describes a technique said to provide a current boost during the switching transition in a current-type write driver by boosting pull-up current during a write current transition.

Note that both U.S. patents above illustrate the state of art, in which transition speed is enhanced at the expense of augmenting power dissipation in the write driver at the transition events.

Data rates in commercial hard disks are expected to move above 3 Gbps in the next few years, and the continued increase in data rates pose a power and heat challenge for designers. Write drivers are typically required to provide about 100 mA of current and use 5V power supplies, or approximately 0.5 W of instantaneous power. Since mobile HDD applications require total power dissipation below 2.5 W including motors, etc., there is a need to provide writing capabilities in hard drives at the progressive higher rates at the lowest power levels possible.

SUMMARY OF THE INVENTION

In this current patent application, an improved low power design is described that uses signal reflections in the transmission lines in a digital signaling system such as a magnetic recording system. These reflections are purposefully exploited to provide additional current for a receiver such as the write coil used for magnetic recording. The invention allows the write driver to provide less current, thus diminishing the power dissipation in the write driver with no speed performance penalty. Even though a magnetic recording system is used as an exemplary embodiment of the invention, those skilled in the art will recognize that the invention applies to high speed digital signaling systems where pre-emphasis of the transmitted signal is desired or required to provide fast digital signal transitions and compensate the low pass filtering response of a transmission line interconnect.

An embodiment of the invention uses a transmitter with source-side termination and termination controls designed to use signal reflection and to speed up transition time in written data. Based on the data to be written, the transmitter in this embodiment determines the timing, signal levels and which of the electrical connections to the transmission line will be terminated (or not) and terminated with what predetermined impedance levels.

One embodiment of the invention is a digital signaling system that includes a transmitter and a remote receiver connected by a transmission line with at least one transmission line termination resistor with switching controls for selectively connecting and disconnecting the transmission line source-side termination resistor. The switching controls dynamically connect and disconnect the one or more resistors from the transmission line so that signal reflections can be exploited to produce an overshoot or pre-emphasis of the transmitted signal to the receiver.

Embodiments of the invention include write driver designs using either voltage or current sources for use in magnetic storage devices with inductive coil based write heads. Embodiments of the invention use source-side dynamically switchable terminations in the transmission to generate signal reflections that constructively add to direct signals to enhance the total current available to drive the receiver such as a write coil. In one embodiment, as a first signal source of one polarity in the write coil is electrically connected, the terminating impedance is electrically disconnected for the second signal of the opposite polarity to generate a transient reflected signal in the write coil that constructively adds to the first signal. By controlling and using the reflections in the transmission line that occur when termination is dynamically removed or restored, current-type write driver embodiments of the invention, for example, can approach the theoretical limit of doubling the current at the coil to $I_w$, with a writer driver current source of $I_w/2$. Thus, the required coil current of approximately $I_w$ can be achieved using current sources dimensioned to provide only $I_w/2$. The invention allows lower instantaneous power dissipation in the write driver because the reflected signal flows through the write coil but not through driver voltage or current sources.

The increased current in the receiver is achieved by Dynamic Termination Control (DTC) of the transmission lines. Electronic switches are used to selectively remove or add termination to the transmission line between the driver power source and the coil. In one embodiment, when the write driver reverses the polarity of the current flowing through the coil, the configuration of the switches removes the termination for the previous current path to cause a reflected current pulse to be generated that constructively adds to the direct current pulse. This reflected wave increases the magnitude of the total current pulse in the coil.

In one voltage-type, differential write driver embodiment, two transistor switches in parallel to terminating resistors are used to switch the terminating resistors in or out of the circuit to generate a transient reflected signal that constructively adds to a direct signal.

In alternative embodiments of the invention, the duration of the period when the reflected signal is generated can be limited by limiting the time that terminating impedance is removed from the circuit. In yet other embodiments of the invention, partial termination can be used in conjunction with switching algorithms to further limit and control the timing and maximum value of the reflected signal as well as the amplitude of the voltage or current the writer driver sends to the receiver.

In yet another embodiment, simultaneous switching of termination at both transmission line terminals at the transmitter end is used. This embodiment provides balanced signals in the differential excitation from write driver to write head.

The optimal overshoot amplitude and overshoot duration produced by the controlled reflections as well as produced by the write driver itself are parameters that can be pre-programmed or found by an optimization procedure where, for instance, a signaling system using this invention would write a specific pattern onto the disk and optimize those parameters for minimal bit error rate (BER) in the read data.

DETAILED DESCRIPTION OF THE INVENTION

Figure 1:
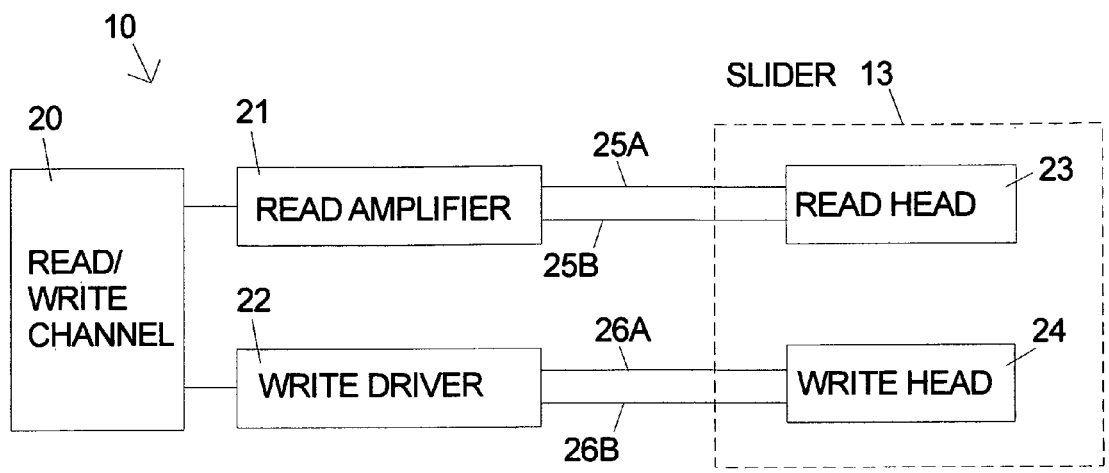
FIG. 1 is a simplified schematic description of selected components in a prior art disk drive including the read and write drivers and the read and write heads.
Figure 2:
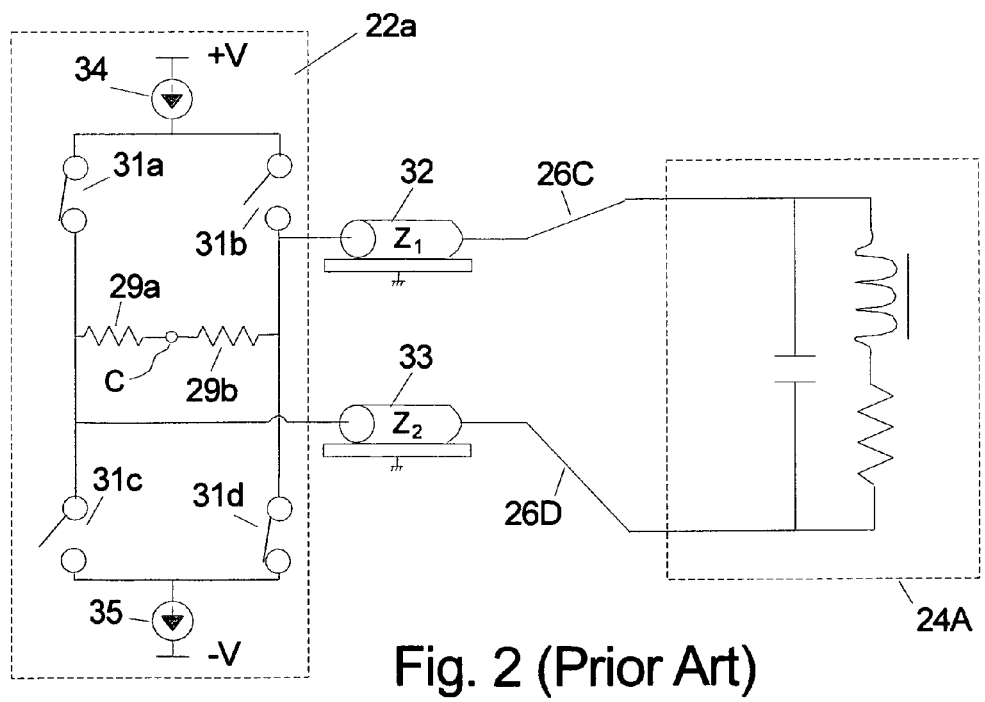
FIG. 2 is a simplified schematic description of a prior art current-type write driver and receiver.
Figure 3:
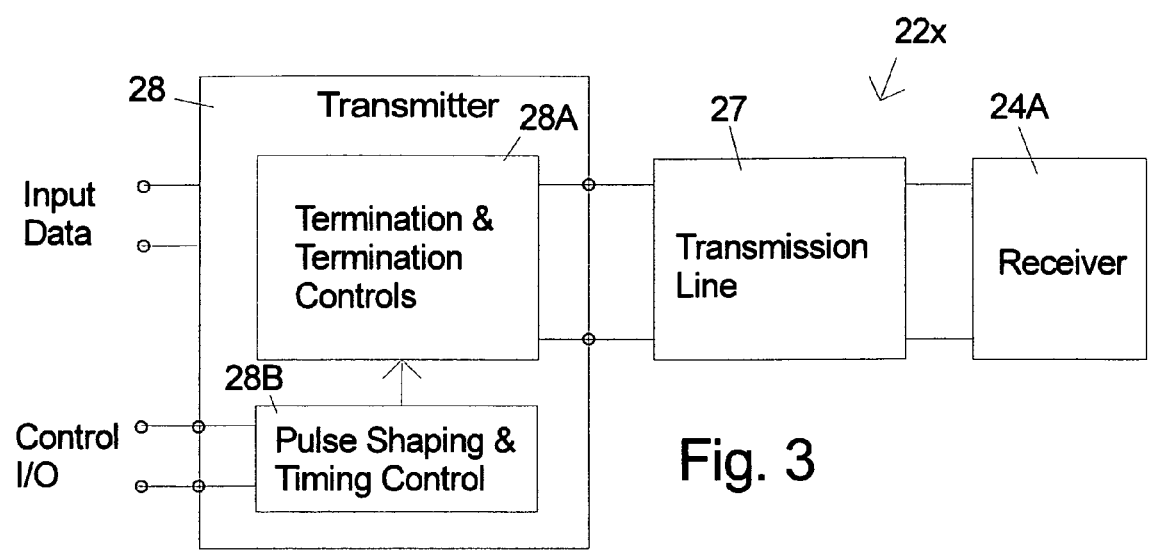
FIG. 3 is a simplified schematic description of an embodiment of the invention.

FIG. 3 is a simplified schematic description of a signaling system 22x embodiment of the invention using a transmitter 28 that includes source-side termination and termination controls 28A and pulse shaping and time control 28B. The transmitter 28 is connected to receiver 24A by transmission line 27. The decisions on the control of the source-side termination are made inside the transmitter based on the input data to be written and the I/O controls supplied by the read/write channel. In alternative embodiments of the invention, the overshoot amplitude, duration and the current level the system returns to after the overshoot are parameters that can be preprogrammed into the system, can be defined (programmed) by the user at any time, or can be determined by means of optimization algorithms that find the optimal value for those parameters to minimize, for instance, bit error rate (BER) in the received data by the receiver or in the read data from the disk. In the particular embodiment of FIG. 3, the transmitter 28, responding the data input and the I/O controls determines the timing, signal levels and which of the electrical connections to the transmission line will be terminated (or not) and terminated with what impedance levels. The transmitter 28 is designed to use signal reflection and to diminish transition time in written data.

The transmitter 28 can be implemented using current sources or voltage sources as will be discussed in more detail below, and the implementation details of the source-side termination will vary accordingly. The invention controls reflected signal (sometimes called "overshoot") durations and values by dynamic control of transmission line termination. Thus, in an embodiment of the invention the overshoot duration is not necessarily fixed by the time of flight of the signal traveling from writer driver to magnetic head. The write driver of the invention can exploit transient signal reflections to provide additional current to the receiver (e.g. coil) and therefore save power in the driver. But, in alternative embodiments the reflections can be stopped (aborted) at a selected time by dynamically re-establishing standard termination of the transmission line through control of the switches in the driver. Thus, in alternative embodiments the driver can create then truncate/abort the signal reflections, shortening the overshoot time to a period that is shorter than the full flight time. The duration of the reflection limits the duration of the overshoot, so in designs where the reflected signal to be exploited is not of sufficient duration the DTC write driver returns momentarily to be equal or better, but not worse, than prior art designs.

In addition, the magnitude of the signal reflection can optionally be changed by tuning the selected impedances, with a corresponding change in the signal source level. An embodiment of the invention can use signal reflections to further boost a signal that already has some overshoot produced by the driver. The level of overshoot can be controlled (reduced from its maximum value) by designing the system to include intermediate impedances. One alternative embodiment could provide a programmable (selectable) option for the termination controls that allows programming a fixed impedance mismatch (either above or below the characteristic impedance of the transmission line) as a special case. Where the transmitter is a current source type driver, the termination controls can be programmed to terminate the transmission line with a fixed impedance higher than a characteristic impedance of the transmission line (up to an open circuit equivalent). When the transmitter is a voltage source type driver, the termination controls can be programmed to leave the transmission line terminated with a fixed impedance lower than a characteristic impedance of the transmission line (down to a short circuit equivalent). However, using intermediate impedances rather than open or short circuit impedances, causes some extra power dissipation at the write driver, since some power is dissipated by these selected intermediate impedances. But only in the worst case would this extra dissipation bring a system using this invention to dissipate as much extra power to make it equal to prior art solutions.

The invention can be used with drivers with voltage driven or current driven sources, and it can be used with differential or single-ended designs. For clarity of illustration the schematics in the figures will be presented in simplified form. For example, switches will be symbolically illustrated as mechanical switches to show in a simple form that selected elements or components are selectively connected into the circuit path or are effectively removed from the circuit path. But the function of the conceptual switches can be implemented in various ways according to the prior art. For example, where the examples below show a conceptual mechanical-like switch in series with a current source, the switching function can be implemented using a transistor that is controlled to operate in a high impedance state or a negligibly low impedance state. But equivalently the current source can be designed to have a selectable "off state" so that the on-off switch is built into the current source. Many other switching solutions can be devised using the prior art.

Figure 4A:
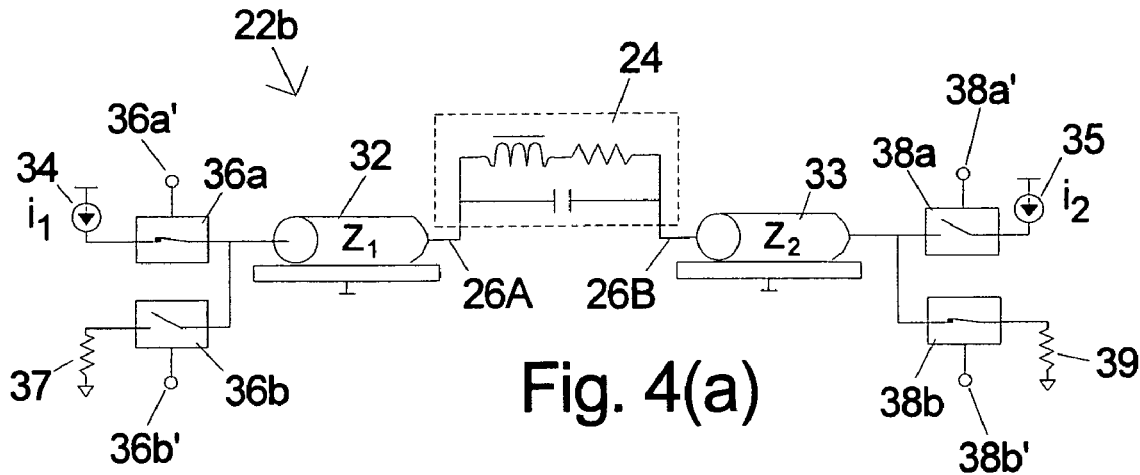
FIG. 4(a) is a simplified schematic description of an embodiment of a current-type write driver according to the invention with a first switch configuration.

A current-driven embodiment will be discussed first. A current-type write driver 22b with Dynamic Termination Control (DTC) according to the invention is conceptually illustrated in FIG. 4(a). FIG. 4(a) is intended to be a conceptual illustration to aid in explaining the concepts of the invention rather than a practical implementation. For example, as will be obvious to those skilled in the art, a single current source can be used. Current sources $i_1$ 34 and $i_2$ 35 alternately supply direct current to write coil 24 through transistor switches 36a, 36b, 38a, 38b. The control lines 36a', 36b', 38a', 38b' for the switches are used to control the on-off state of the switches and are connected to switch control circuitry such as shown in FIG. 4(c) and which will be further discussed below. The control circuitry for the switches can be implemented using prior art techniques. Although four control lines are shown, in one alternative embodiment the control circuitry reduces these four lines to a single digital control line which selects whether the four switches are in the state shown in FIG. 4(a) or in the state shown in FIG. 4(b) as will be discussed further below.

The transistor switches are used to control the direction of current flow through the write coil 24 and the connection/activity of the terminating resistors 37, 39. When switch 36a is closed as shown in FIG. 4(a), switch 36b is open. Thus, in this first embodiment, switches 36a, 36b are used to either connect source $i_1$ 34 or resistor 37 to the left side of the write coil 24. The impedance of resistor 37, which is connected to signal ground, is selected to provide transmission line termination when switch 36b is closed. Preferably, the impedance of resistors 37 and 39 are respectively equal to $Z_1$ and $Z_2$.

The components of the right side of the write coil 24 are similar to those described above on the left; however, the switches 38a, 38b are operated in opposite coordination with switches 36a, 36b in this embodiment. Thus, when switch 38b is open, switch 36b is closed and so forth. This means that only one of the two termination resistors 37, 39 is electrically connected into the circuit at a time. (In an alternative embodiment described below, the two termination resistors can be connected at the same time in order to truncate the signal reflection.) When the switch from one configuration state to the other occurs, the effect is to remove a terminating resistor and generate a transient signal current reflection that is exploited to produce higher current levels in the coil than are provided by the direct current from either current source. Thus, unlike the continuously terminated lines in the write drivers in the prior art, this embodiment of the invention boosts the write signal current in the coil by exploiting reflection on the line caused by dynamic removal of a terminating resistor. The increased write signal current is achieved without drawing additional current from the write driver current sources and, therefore, this is a power saving solution that does not reduce writing transition speed at the write coil. The effect in the coil is the same for direct current sourced by the write driver and current produced by use of signal reflections.

The switch configuration in FIG. 4(a), referred to in this document as first state for the switches, connects current source $i_1$ 34 in series through closed switch 36a through the coil 24 then through closed switch 38b and through resistor 39 to signal ground. In this state, the current source $i_1$ 34 transmission line is terminated through resistor 39 to signal ground. Switch 38a is open, which disconnects current source $i_2$ 35 from the coil 24. Switch 36b is also open in this state. The direction of direct current from current source $i_1$ 34 through the coil will arbitrarily be called "negative," and the direction of direct current from current source $i_2$ 35 through the coil will be called "positive."

Figure 4B:
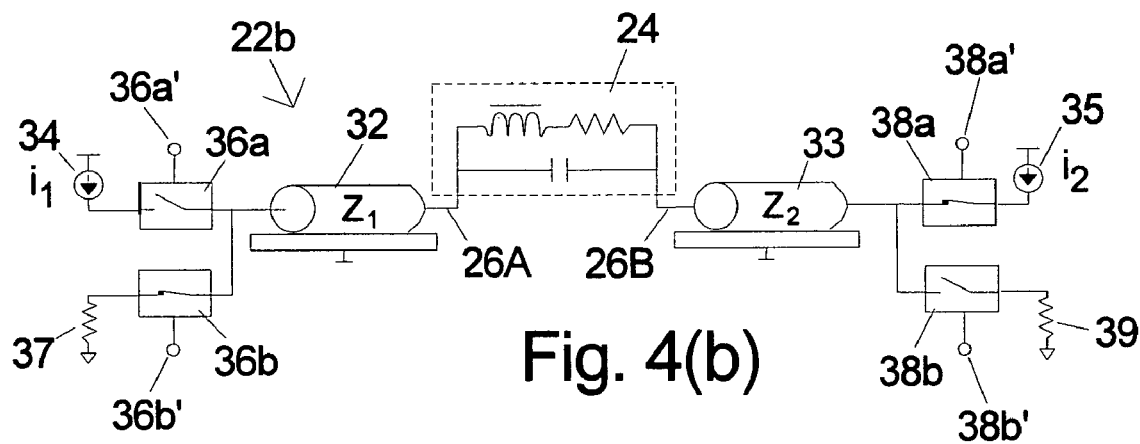
FIG. 4(b) is a simplified schematic description of an embodiment of a current-type write driver according to the invention with a second switch configuration.
Figure 4C:
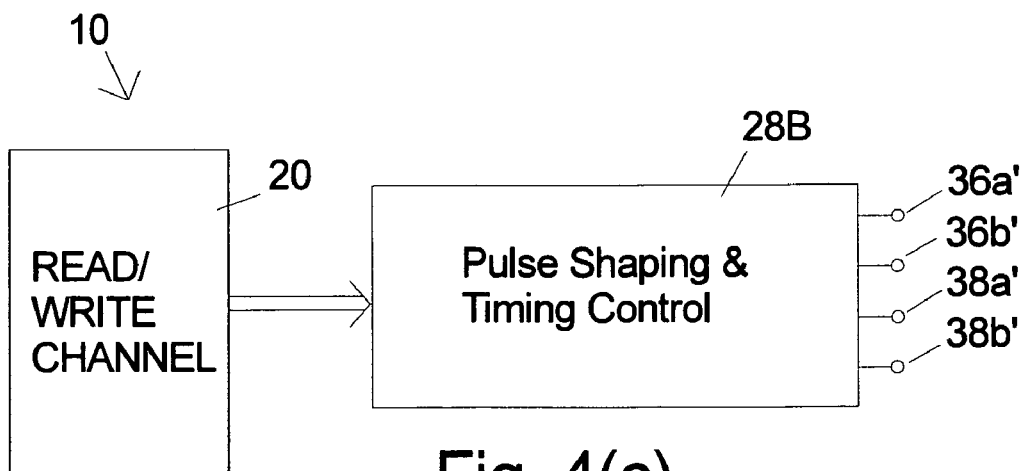
FIG. 4(c) is a conceptual schematic description of the switch control circuitry in an embodiment according to the invention.

FIG. 4(b) is a simplified schematic illustration a second switch configuration in a write driver 22b according to the invention. The four switches in this second configuration (or state) are reversed from their state in the first configuration (or state) shown in FIG. 4(a). Thus, switch 38a is now closed and 38b is open which allows current from source $i_2$ 35 to flow through coil 24 in the opposite (positive) direction. Switch 36a is open, which disconnects current source $i_1$ 34, and switch 36b is closed to connect resistor 37 (which is connected to signal ground) into the current path.

The pulse shaping and timing control circuitry 28B for the current-type driver embodiment of FIGS. 4(a) and 4(b) is illustrated in FIG. 4(c). In this embodiment the standard write signals from the read/write channel 20 are used as input to the to generate signals for switch controls 36a', 36b', 38a', 38b'. The pulse shaping and timing control circuitry 28B can be implemented using standard logic elements. Pulse shaping and timing control circuitry in other embodiments can have different inputs and a different number of output signals as will be described below. The control signals are a function of the data sequence to be written (optionally modified by user inputs such as specific overshoot level and duration, or determined by an optimization algorithm that adjusts overshoot level and duration to minimize BER in the read data).

The transitions back and forth (toggling) between the positive current flow and the negative current flow, write magnetic reversals in the magnetic media that are used to encode bits of information. In this embodiment, the toggling of the write driver is under the control of the read/write channel, which supplies the input data as in the prior art. The invention exploits transmission line reflections in transiently unterminated lines to produce higher maximum instantaneous current levels in the write coil than are provided by either current sources $i_1$ 34 or $i_2$ 35. The operation of the write driver 22b according to the invention will be explained with reference to the transition of the switch states back and forth between the negative configuration of FIG. 4(a) and the positive configuration of FIG. 4(b). First assume that the negative configuration of FIG. 4(a) has been established long enough for any reflections to have been reduced to negligible levels and that current from $i_1$ 34 is flowing into the components as indicated in FIG. 4(a).

Figure 5:
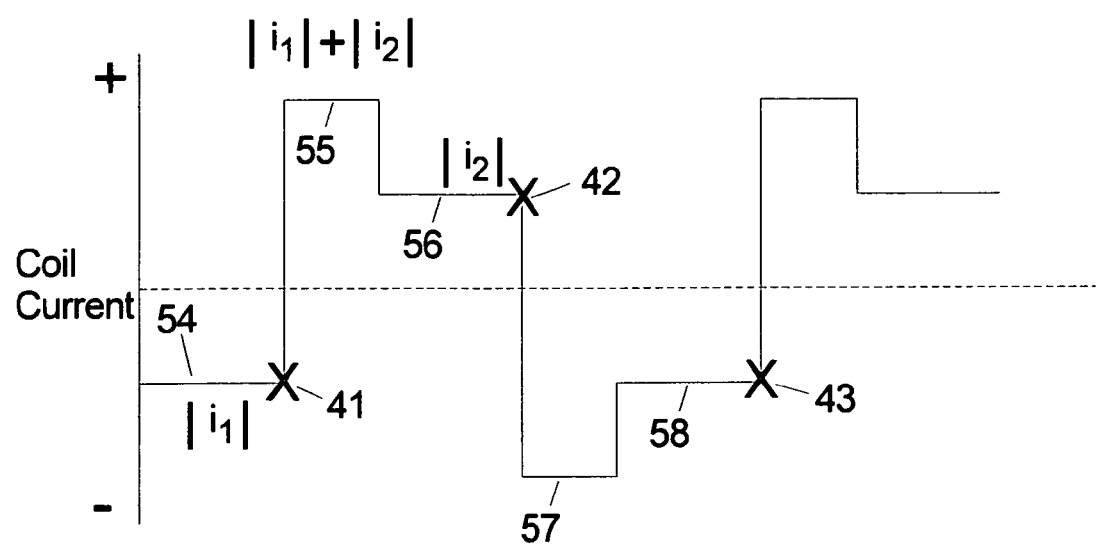
FIG. 5 is a graph illustrating the current flow in the coil according to an embodiment of the invention.

FIG. 5 is a simplified graph of the current flowing in the coil which will be used in the explanation of the operation of the write driver 22b. The current flow $i_1$ through the coil as described in the paragraph above is shown as horizontal segment 54 on the graph. For simplicity of illustration the current is shown as square waves but the actual wave forms will be rounded, since there is no instantaneous response in real systems. The signal from current source $i_1$ 34 is effectively terminated through resistor 39 to signal ground in this state.

Now assume that the switch configuration flips from that of FIG. 4(a) to that of FIG. 4(b), that is from negative to positive. This switching point is labeled as 41 in FIG. 5. In the positive configuration, the current source $i_1$ 34 is disconnected from the circuit by open switch 36a (that is, transistor switch 36a is in non-conducting, high impedance mode), but the already launched $i_1$ current signal traveling from the left to the right (according to the layouts of the figures) fills both transmission lines 32, 33 and will now be momentarily reflected by the high impedance provided by both current source $i_2$ 35, which is connected through closed switch 38a and open switch 38b which previously connected resistor 39. The current $i_1$ injected into the transmission lines will propagate until properly terminated. When switch 38b opens, the termination provided by resistor 39 is removed which effectively removes the previous termination. Therefore, the already launched $i_1$ current above will only terminate through resistor 37 which is now connected in the circuit by the closed switch 36b on the opposite side of the coil. In this way a reflected $-i_1$ current is transiently generated which flows through the coil in the opposite direction (right to left in FIG. 4(b)). The reflected $-i_1$ current would be viewed as an undesirable "overshoot" in traditional designs.

At the same time as the reflected current $-i_1$ is being generated, current source $i_2$ 35 injects its current $i_2$ into the transmission line through closed switch 38a. The reflected $-i_1$ current flows in the opposite direction from the direct $i_1$ current. Thus, the reflected $-i_1$ current flows through the coil in the same direction as the direct $i_2$ current. The result is that direct $i_2$ current and the reflected $-i_1$ current through the coil constructively combine (add) and produce an effective value of:

$$i_{eff} = |-i_1| + i_2|$$

for the time period depicted in FIG. 5 as segment 55. The magnitude of the current $i_{eff}$ through the coil at this time can be effectively twice that which is supplied by either current source.

The effect is transient because the reflected $-i_1$ current eventually ends after a period equal to the time of signal flight through transmission lines 32, 33. The current through the coil then falls to the $i_2$ current value which is represented as segment 56 in FIG. 5.

When the write driver switches from the positive configuration to the negative configuration, the result is similar but of opposite sign. The switch from positive to negative is shown as point 42 in FIG. 5. The current source $i_2$ 35 is now disconnected with the opening of switch 38a and current source $i_1$ 34 is switched into the circuit. The already launched $i_2$ current traveling from the right to left (according to the layouts of the figures) fills both transmission lines, will now be momentarily reflected by the high impedance provided by both current source $i_1$ 34, which is connected through closed switch 36a and open switch 36b (which previously connected resistor 37) and will only terminate through resistor 39 which is now connected by the closed switch 38b. At the same time, current source $i_1$ 34 injects its own current into the transmission lines. The result is that direct $i_1$ current and the reflected $-i_2$ current through the coil combine (add) and produce a current:

$$i_{eff} = |i_1| + -i_2|$$

for the time period depicted in FIG. 5 as segment 57. The direction of the current in segment 57 is opposite to that of segment 55. The momentarily reflected $-i_2$ current eventually ends leaving only the direct $i_1$ current flowing in the coil as depicted by segment 58. At switching point 43 the write driver again switches to the positive configuration and the process repeats as described above.

Programmability of the current levels, both the reflected and direct, can be accomplished by control of the time the transmission lines are kept non-terminated and control of the current levels injected in the lines by current sources $i_1$ 34 and sources $i_2$ 35. It should be noted that whenever the transistor switches open or close, there is a propagation delay before the coil sees any effect produced by the transition of the switches. This propagation delay is proportional to the length of the interconnecting components from the write driver to the coil. FIG. 5 does not show the propagation delay. The switches are thrown every time a change in polarity in the current is required to write a magnetic transition on the magnetic media, and the current level at the coil is shown in FIG. 5 as an idealized instantaneous response. Ideally the switches are thrown (opened or closed) simultaneously. The finite propagation time for the current signal from writer driver to the coil is essential for the reflected current to be generated. Thus, the invention exploits the natural propagation delay on the transmission line to make the current amplitude reach higher levels when the switches are thrown resulting in the consequent reversal of current direction and augment of current level perceived by the coil.

An alternative method of describing the current-type embodiment of the invention will be presented in the following. The write coil 24 has two electrical connections or leads 26A, 26B connected to transmission lines 32, 33. The first lead 26A of the write coil and transmission line 32 is switchably connected (using switches 36a, 36b) to either the first resistor 37, which is in turn connected to signal ground, or the first current source 34. The second lead 26B of the write coil and transmission line 33 is selectively connected (using two switches 38a, 38b) to either the second resistor 39, which is in turn connected to signal ground, or the second current source 35. In this embodiment the write driver is generally maintained in one of two states which will be called positive and negative. In a first state (negative) the first current source 34 is connected to the coil to drive a direct current through the coil and into the terminating resistor 39 and then to signal ground. In a second state (positive) the second current source 35 is connected to the coil to drive a direct current through the coil in the opposite direction and into the terminating resistor 37 and then to signal ground. A magnetic transition is written in the magnetic media in the storage device by switching the write driver from one state to the other and thereby reversing the direction of current flowing in the coil and generating a reflected current pulse that adds to the direct current from one of the current sources. The write operation, therefore, has two polarities that correspond to writing either a "1" or a "0" binary bit of information. Thus, one write operation can be described as beginning with the write driver in the negative state as shown in FIG. 4(a). The write operation then opens switch 36a, closes switch 36b, opens switch 38b and closes switch 38a. These operations are preferably performed approximately simultaneously.

The reciprocal write operation can be described as beginning with the write driver in the positive state as shown in FIG. 4(b). The write operation then opens switch 36b, closes switch 36a, opens switch 38a and closes switch 38b. These operations are preferably performed approximately simultaneously.

Figure 6:
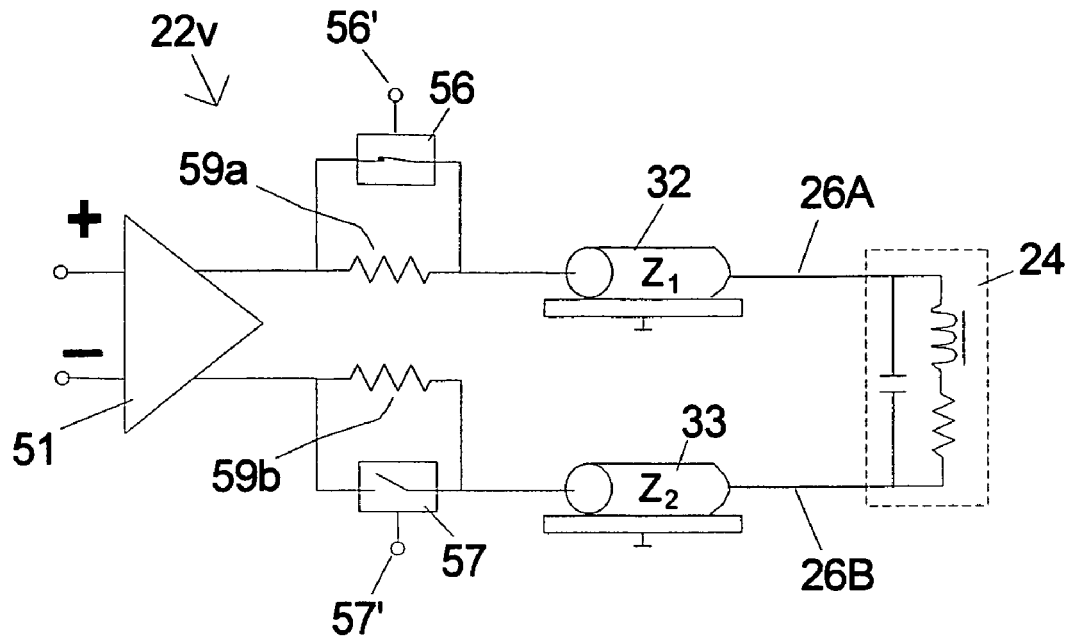
FIG. 6 is a simplified schematic description of an embodiment using a voltage-type write driver according to the invention with a first switch configuration.

FIG. 6 is a conceptual illustration of an embodiment using a voltage-type write driver 22v according to the invention with a first switch configuration (or switch state). In this embodiment a differential voltage source type driver 51 provides the power and is supplied input data. Between the voltage source output lines and transmission lines 32, 33 for the write coil 24 are terminating resistors 59a, 59b in parallel with transistor switches 56, 57 which have control lines 56', 57'. Because switch 56 is electrically parallel to the resistor 59a, when switch 56 is closed (conducting) as shown it has the effect of removing terminating resistor 59a from the circuit. Thus, when switch 56 is open, resistor 59a acts as transmission line termination impedance, but switch 56 allows the termination to be removed under the control of line 56'. Switch 57 and resistor 59b operate in an analogous way.

Figure 7:
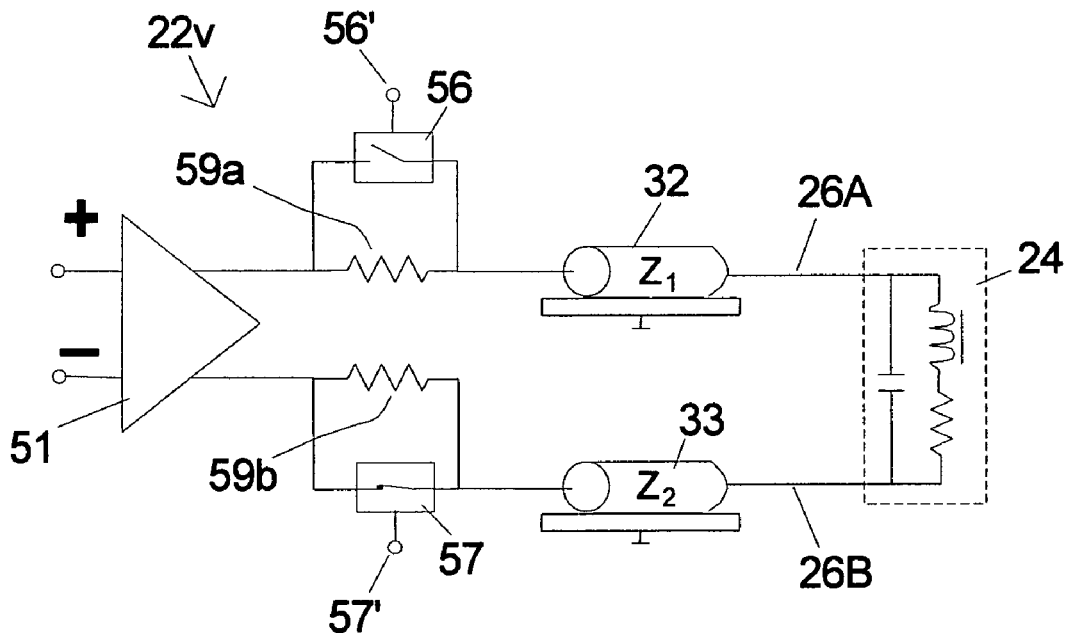
FIG. 7 is a simplified schematic description of an embodiment using a voltage-type write driver according to the invention with a second switch configuration.

FIG. 7 shows the voltage-type write driver 22v according to the invention with a second switch configuration (or switch state) in which switch 56 is open and switch 57 is closed. In a first embodiment, the write driver 22v operates by toggling between the two switch configurations. The functioning of the voltage-type embodiment is in principle analogous to that of the current-type described above. When the driver toggles from one switch configuration to the other, the transient inflight signal is effectively unterminated and is reflected so that it constructively adds to the new direct signal generated by the voltage driver. The current at the write coil would have the same shape as the current shown in FIG. 5 and would include a transient overshoot period in which the voltage of the reflected signal constructively adds to the direct voltage signal.

The switching controls for the voltage-type embodiment of FIGS. 6 and 7 has only two outputs. In this embodiment the standard write signals from the read/write channel 20 are used as input to the switch control circuitry to generate signals for switch control lines 56', 57'. The control circuitry can be implemented using standard logic elements.

Those skilled in the art will recognize that the switch control circuitry could be pre-programmed with knowledge of the time of flight between read/write drivers and read/write head, or can be equipped with extra circuits that use a pre-programmed algorithm to determine the flight time once the system is brought to operation.

An alternative embodiment of the invention that truncates the reflected signal will now be discussed. In either voltage or current driven embodiments it is possible that the natural duration of the reflected signal at the write coil could exceed that which is needed given the target data rate of the storage system. The overshoot created from a reflected signal will have a natural duration defined by the "time of flight" $\Delta t_{flight}$ of the signal (the source outputs) to the write coil and back. In the event that $\Delta t_{flight}$ is greater than is required for the target data rate, the overshoot can be effectively truncated by reconnecting the terminating resistor into the circuit. In this family of embodiments the write drivers will have additional switch configurations that will be established by the switch control circuitry. For example, using the voltage source embodiment as a base, an alternative that truncated the overshoot period would transition from a configuration of FIG. 6 to a configuration of FIG. 7 (or vice versa) and, after some desired overshoot time, would transition to a new configuration in which both switches 56, 57 are open. After some time, when there is no signal to be reflected present in the line, one of the switches would return to its position as depicted in FIG. 7 (or FIG. 6 in the case of the transition in the opposite direction), which would make the system using DTC save power by not running current through its source-side termination associated with the active voltage source. The switch control circuitry implementing this embodiment could include timers that limit the duration that the switches remain closed after a voltage driver reversal. A current-type embodiment that implemented truncation would similarly have timing logic that would reconnect the terminating resistance after the selected time period, and might disconnect it after some desired time interval, when there is no signal on the line that might be usable with exploitation of reflections, which would also save power in the write driver.

Figure 8:
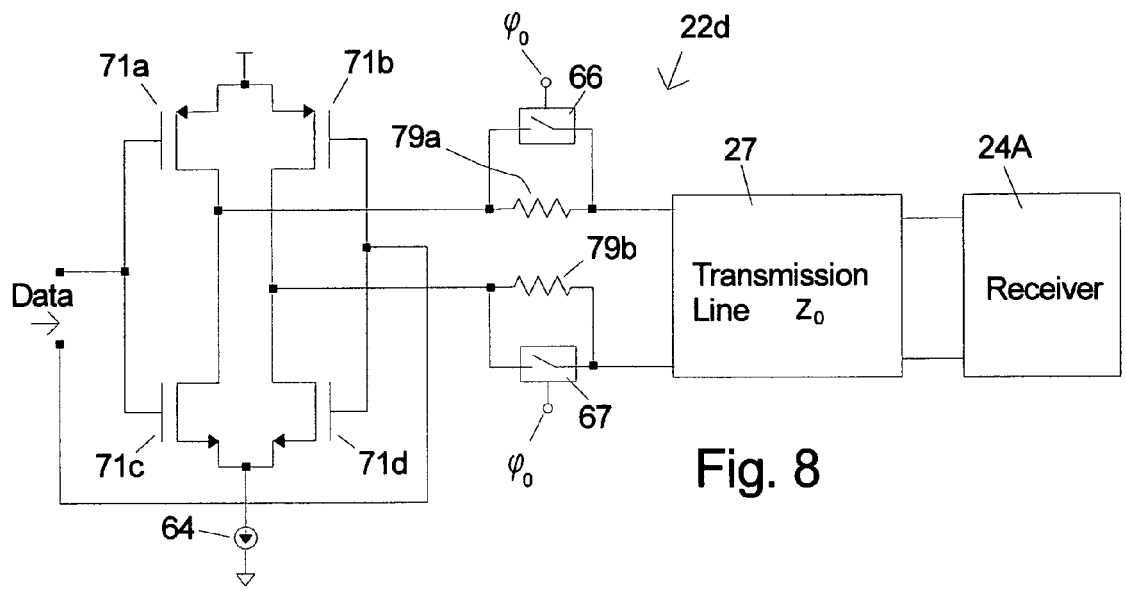
FIG. 8 is a simplified schematic description of an embodiment of the invention using a voltage source based differential write driver with enforced balance of signals.

FIG. 8 is a simplified schematic description of an embodiment of the invention using a voltage source based differential amplifier write driver 22d with enforced balance of signals. Complementary Metal-Oxide Semiconductor (CMOS) transistors 71a, 71b, 71c, 71d are arranged in a differential voltage amplifier configuration and are biased using current source 64. Termination resistors 79a, 79b are connected in parallel with switches 66, 67 respectively and are preferably equal to $R_0/2$. In the case of a lossless transmission line $R_0=Z_0$. The same control signal represented by $\phi_0$ is used for the switches 66, 67. By tying the control lines of switches 66, 67 together, the symmetry and balance of the signals in the transmission line is enforced in this embodiment. In this differential implementation, the simultaneous switching of both termination loads is desirable and makes the signal balanced. A virtual ground, therefore, appears in the center of symmetry of the circuit. Using differential balanced signals, diminishes the potential coupling of signaling to other systems whose traces might be laid out in close proximity.

Figure 9:
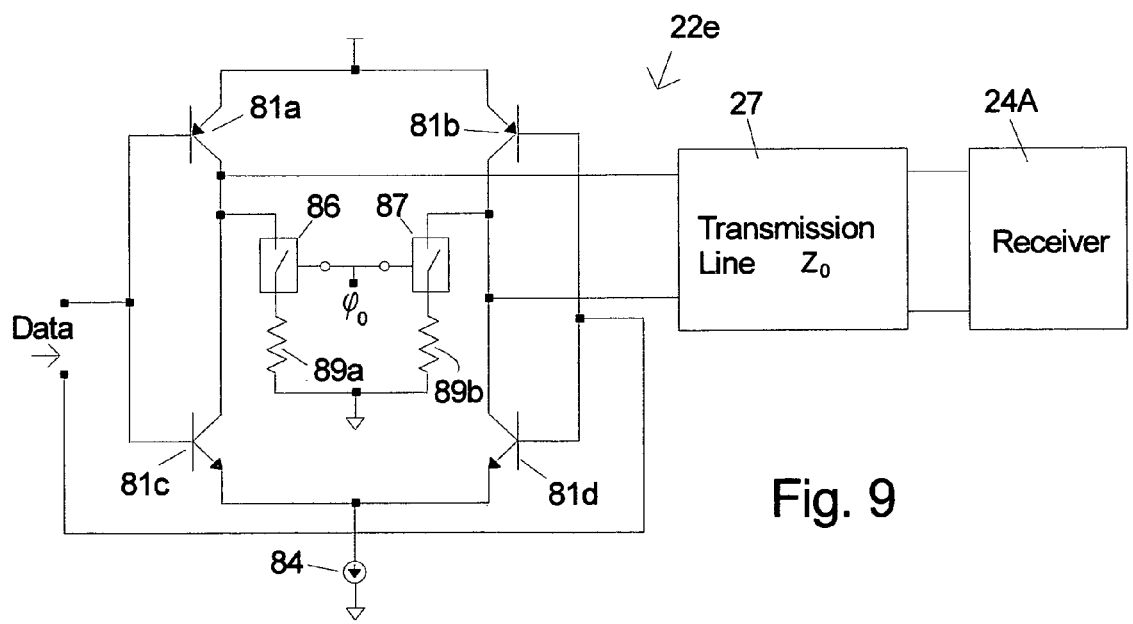
FIG. 9 is a simplified schematic description of an embodiment of the invention using a current source based differential write driver with enforced balance of signals.

FIG. 9 is a simplified schematic description of an embodiment of the invention using a current source based differential write driver 22e with enforced balance of signals. Bipolar transistors 81a, 81b, 81c, 81d are arranged in a differential current amplifier configuration and are biased using current source 84. Termination resistors 89a, 89b are connected in series with switches 86, 87 respectively and are preferably equal to $R_0/2$. In the case of a lossless transmission line $R_0=Z_0$. The same control signal represented by $\phi_0$ is used for the switches 86, 87. By tying the switches 86, 87 together, the symmetry and balance of the signals in the transmission line is enforced in this embodiment.

The invention has been described in the form of specific embodiments. Alternatives and variations which are apparent or obvious to those of skill in the art are intended to be within the scope of the invention. Those skilled in the art will recognize that the invention description above, even though it was presented using its application to storage (hard disk drive) system, can be extended to other high speed digital links where transmission line effects can be exploited to produce a desired overshoot of the transmitted signal. In such systems, the overshoot may be called a pre-emphasis of the transmitted signal and might be used to provide sharper transitions at the receiver side and compensate for possible bandwidth limitations in the link between transmitter and receiver. Those skilled in the art will also recognize that where the receiver is represented by the resistor "R", the "L" and "C" elements can be interpreted as parasitic components that might be related for instance to package parasitics at the receiver end. In this case, the invention in this patent application would provide for a low power solution generating a pre-emphasis of the transmitted signal by dynamic exploitation of signal reflections.

The invention claimed is:

1. A signaling system comprising:
   a receiver;
   a transmission line connecting the receiver to a transmitter; and
   the transmitter, which sends a signal to the receiver through the transmission line, the transmitter including first and second source-side termination configurations and termination controls for switching from first source impedance termination configuration to second source impedance termination configuration and thereby generating a transient current in the receiver that is composed of a reflected current and a direct current and wherein the transient current is higher than the direct current.

2. The signaling system of claim 1 wherein the termination controls include means for aborting the reflected current signal after a controlled period of time.

3. The signaling system of claim 2 wherein the means for aborting the reflected current include means for terminating the transmission line at the transmitter end with an impedance approximately equal to a characteristic impedance of the transmission line.

4. The signaling system of claim 1 wherein the first source-side termination configuration applies a first impedance approximately equal to a characteristic impedance of the transmission line and the second source-side termination configuration applies a second impedance that is not equal to the first impedance and produces the reflected current.

5. The signaling system of claim 4 further comprising means for stopping the reflected current after a selected period of time has elapsed by terminating the transmission line at the transmitter end with the characteristic impedance of the transmission line.

6. The signaling system of claim 1 wherein the first and second source-side termination configurations include at least first and second selectable impedances with a first selectable impedance being an impedance approximately equal to a characteristic impedance of the transmission line and a second selectable impedance being a lower impedance than the characteristic impedance, which terminates the transmission line and produces the reflected current.

7. The signaling system of claim 1 wherein the first source-side termination configuration includes at least first and second selectable impedances with a first selectable impedance being an impedance approximately equal to a characteristic impedance of the transmission line and a second selectable impedance, being a higher impedance than the characteristic impedance, which terminates the transmission line and produces the reflected current.

8. The signaling system of claim 1 wherein signaling overshoot amplitudes, overshoot durations or current levels for the system to return to after overshoot are programmable.

9. The signaling system of claim 1 further comprising means for executing an optimization algorithm to determine an optimal signaling overshoot amplitude, an optimal signaling overshoot duration or a current level for the system to return after overshoot.

10. The signaling system of claim 1 wherein the transmitter is a current source type driver, and wherein the second source impedance termination configuration terminates the transmission line with a fixed impedance higher than a characteristic impedance of the transmission line.

11. The signaling system of claim 1 wherein the transmitter is a voltage source type driver, and wherein the second source impedance termination configuration terminates the transmission line with a fixed impedance lower than a characteristic impedance of the transmission line.

12. A method of operating a signaling system comprising:
establishing a first current flowing in a first direction in a receiver through a transmission line terminated with a first source impedance configuration; and
switching to a second source impedance configuration to terminate the transmission line, the second source impedance configuration generating a first reflected current flowing in second direction in the receiver, the second direction being opposite from the first direction and while the first reflected current is flowing in the second direction, driving a direct current signal into the receiver that adds to the reflected current and thereby enhances the direct current signal.

13. The method of claim 12 further comprising aborting the first reflected current after a controlled period of time after switching to the second source impedance configuration.

14. The method of claim 12 wherein switching to a second source impedance configuration further comprises increasing source-side termination impedance to a value higher than a characteristic impedance of the transmission line.

15. The method of claim 12 wherein switching to a second source impedance configuration further comprises decreasing source-side termination impedance to a value lower than a characteristic impedance of the transmission line.

16. The method of claim 12 wherein the signaling system includes first and second termination resistors in parallel with first and second switches respectively and wherein switching to the second source impedance configuration further comprises approximately simultaneously removing first and second termination resistors from the transmission line by closing first and second switches.

17. The method of claim 12 wherein the signaling system includes a differential voltage source with first and second source termination resistors in parallel with first and second switches respectively, and wherein switching to a second source impedance further comprises closing the second switch and opening the first switch.

18. The method of claim 17 further comprising transmitting a signal to the receiver with the second switch closed and the first switch open.

19. A method of operating a storage device comprising:
establishing a first current flowing in a write coil in a first direction with a first driver signal using a first source impedance termination configuration for a transmission line connecting a write driver and the write coil; and
writing a first polarity magnetic transition by switching to a second source impedance termination configuration selected to generate a reflected current flowing in the write coil in the second direction that adds to the first current to form an enhanced signal current in the write coil.

* * * * *